United States Patent
Iwase et al.

(10) Patent No.: US 8,766,418 B2
(45) Date of Patent: Jul. 1, 2014

(54) SEMICONDUCTOR DEVICE

(71) Applicant: Panasonic Corporation, Osaka (JP)

(72) Inventors: Teppei Iwase, Hyogo (JP); Takashi Yui, Shiga (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/150,862

(22) Filed: Jan. 9, 2014

(65) Prior Publication Data
US 2014/0124911 A1    May 8, 2014

Related U.S. Application Data

(63) Continuation of application No. PCT/JP2012/006260, filed on Sep. 28, 2012.

(30) Foreign Application Priority Data

Mar. 14, 2012   (JP) ................. 2012-057021

(51) Int. Cl.
*H01L 23/495*   (2006.01)
*H01L 23/538*   (2006.01)

(52) U.S. Cl.
CPC .... *H01L 23/49534* (2013.01); *H01L 23/49579* (2013.01)
USPC ........... 257/669; 257/674; 257/676; 257/677; 257/737; 438/108; 438/123; 438/125

(58) Field of Classification Search
CPC ..... H01L 21/84; H01L 23/481; H01L 23/488; H01L 23/495; H01L 23/49579; H01L 23/49534
USPC ........... 257/532, 669, 737; 438/108, 110, 118
See application file for complete search history.

(56) References Cited

U.S. PATENT DOCUMENTS

| | | | |
|---|---|---|---|
| 6,891,248 B2* | 5/2005 | Akram et al. | 257/532 |
| 7,041,537 B2* | 5/2006 | Akram et al. | 438/127 |

(Continued)

FOREIGN PATENT DOCUMENTS

| | | |
|---|---|---|
| JP | 2003-243604 | 8/2003 |
| JP | 2004-311697 | 11/2004 |

(Continued)

OTHER PUBLICATIONS

International Search Report of PCT Application No. PCT/JP2012/006260 dated Oct. 30, 2012.

*Primary Examiner* — Olik Chaudhuri
*Assistant Examiner* — Nicholas Tobergte
(74) *Attorney, Agent, or Firm* — Panasonic Patent Center

(57) ABSTRACT

A semiconductor device includes a first semiconductor chip; an extension formed at a side surface of the first semiconductor chip; a connection terminal formed on the first semiconductor chip; a re-distribution part formed over the first semiconductor chip and the extension and including an interconnect connected to the connection terminal and an insulating layer covering the interconnect; and an electrode formed above the extension on a surface of the re-distribution part and connected to the interconnect at an opening of the insulating layer. The electrode is mainly made of a material having an elastic modulus higher than that of the interconnect. The electrode includes a bonding region where the electrode is bonded to the interconnect at the opening, and an outer region closer to an end part of the extension. The interconnect is formed so as not to continuously extend to a position right below the outer region.

8 Claims, 4 Drawing Sheets

(56) References Cited

U.S. PATENT DOCUMENTS

| | | | |
|---|---|---|---|
| 7,632,711 B2 * | 12/2009 | Terui | 438/110 |
| 7,898,834 B2 * | 3/2011 | Kim et al. | 365/51 |
| 8,314,491 B2 * | 11/2012 | Yamashita et al. | 257/737 |
| 2003/0215993 A1 | 11/2003 | Oshima | |
| 2004/0203244 A1 | 10/2004 | Oshima | |
| 2005/0173797 A1 | 8/2005 | Oshima | |
| 2005/0173808 A1 | 8/2005 | Oshima | |
| 2005/0173813 A1 | 8/2005 | Oshima | |
| 2005/0194694 A1 | 9/2005 | Takahashi | |
| 2013/0299957 A1 * | 11/2013 | Kobayashi et al. | 257/676 |

FOREIGN PATENT DOCUMENTS

| | | |
|---|---|---|
| JP | 2005-251953 | 9/2005 |
| JP | 2010-141080 | 6/2010 |
| WO | 2012/107972 | 8/2012 |

* cited by examiner

220

SEMICONDUCTOR DEVICE

CROSS-REFERENCE TO RELATED APPLICATIONS

This is a continuation of International Application No. PCT/JP2012/006260 filed on Sep. 28, 2012, which claims priority to Japanese Patent Application No. 2012-057021 filed on Mar. 14, 2012. The entire disclosures of these applications are incorporated by reference herein.

BACKGROUND

With function enhancement, the volume of data in systems such as digital TV sets and recorders has been dramatically increased. As a result, an increase in memory capacity and a high data transmission rate have been required for semiconductor memories mounted on the systems.

Examples of semiconductor devices including the foregoing semiconductor memories include system-on-chips (SoCs), each of which is a single chip into which a semiconductor logic circuit chip on which a memory controller is mounted and a memory are integrated. Moreover, the examples also include system-in-packages (SiPs) in each of which a semiconductor logic circuit chip on which a memory controller is mounted and a memory chip are stacked on each other and are housed in a single package.

Recently, systems using SiPs manufactured at relatively low cost have been increased.

For such semiconductor devices, a method using a chip-on-chip (CoC) technique is employed as a method for electrically connecting the semiconductor logic circuit chip and the memory chip together. According to such a method, the semiconductor logic circuit chip and the memory chip are, at electrodes thereof, directly connected together through metal protrusions made of, e.g., solder, gold, or copper such that a circuit formation surface of the semiconductor logic circuit chip and a circuit formation surface of the memory chip face each other. This method has been broadly used for the purpose of increasing a data transmission rate.

A semiconductor device described in Japanese Unexamined Patent Publication No. 2010-141080 (hereinafter referred to as "Patent Document 1") is an example of the configuration in which an access from external terminals of a package to functions of a semiconductor logic circuit chip is made. That is, electrodes are formed within an outer circumferential region of the logic circuit chip which does not face a memory chip, and, e.g., wire bonding is used to connect the electrodes respectively to electrodes formed on an adjacent substrate through thin metal wires made of, e.g., gold, aluminum, or copper.

SUMMARY

In the semiconductor device described in Patent Document 1, the semiconductor logic circuit chip smaller than the memory chip is stacked on the memory chip. However, a size relationship between the semiconductor logic circuit chip and the memory chip varies depending on products.

In the case of a high memory capacity, the memory chip is larger than the logic circuit chip. In this case, it is necessary to prepare the logic circuit chip having a size greater than that of the memory chip. As a result, the number of chips formed from a single wafer is decreased, resulting in a high cost. The positions of the memory chip and the logic circuit chip may be vertically inverted, and the electrodes for wire bonding may be formed on the memory chip. However, in such a case, it is necessary to form a special circuit for wire bonding in an interconnect region of the memory chip, resulting in lower versatility of the semiconductor device.

On this point, a semiconductor device 100 including an extended chip 103 in which an extension 102 extends from an outer circumferential wall of a logic circuit chip 101, i.e., a lower chip in a multilayer structure, as illustrated in FIG. 1A may be used. In the semiconductor device 100, a re-distribution layer (RDL) 150 including interconnects 151 each electrically connected to a corresponding one of connection terminals 104 of the logic circuit chip 101 is formed over the logic circuit chip 101 and the extension 102 made of resin at a surface of the extended chip 103 facing a memory chip (not shown in the figure). Each electrode 106 for wire bonding is formed on a surface of the RDL 150 in a region above the extension 102 so as to be connected to a corresponding one of the interconnects 151. Since the size of a lower chip is expanded as described above, packaging can be realized with high versatility at low cost even in the case of a large-capacity memory chip.

In the foregoing structure, since part of the semiconductor device 100 below the electrodes 106 and the interconnects 151 is formed of elastic bodies such as an insulating layer 152 and the extension 102, there is a possibility that the elastic modulus of such bodies is significantly reduced due to heat, a load, or ultrasonic oscillation upon wire bonding, and then the elastic bodies are severely deformed. When such deformation occurs, a load or oscillation is not sufficiently transmitted to the electrodes 106. Thus, it is necessary, in order to ensure bondability to the electrodes 106, that a load or an amplitude upon bonding is increased as compared to that in the case of bonding to the connection terminals 104 formed on the logic circuit chip 101. However, under wire bonding conditions of a high load, deformation or detachment is more likely to occur in part of the structure right below the electrodes 106 and in the periphery thereof.

As in the elastic bodies such as the insulating layer 152 and the extension 102, the material (e.g., copper or aluminum) of the interconnects 151 has such a property that the material is likely to be deformed due to a load or oscillation. Thus, the interconnects 151 may also be severely deformed, and great strain between adjacent ones of the foregoing materials may occur.

Moreover, in a wiring process, the insulating layer 152 formed below the interconnects 151 are formed by, e.g., application using spin coating. As a result, the insulating layer 152 has less adhesion as compared to other layers, and the adhesion of the insulating layer 152 is further reduced under high-temperature environment. In particular, physical damage such as detachment and cracking is likely to occur in the vicinity of an interface between the interconnect 151 and the insulating layer 152.

In the electrode 106 described above, a width d1 of an opening 107 should be, referring to FIG. 1B, obtained by adding a margin for misalignment in bonding to a width d2 of a region 108 required for wire bonding. Moreover, a width d3 of the electrode 106 should be obtained by adding a margin for misalignment in wiring to the width d1 of the opening 107. As a result, it is necessary that the width d1 of the opening 107 and the width d3 of the electrode 106 are greater than the width d2 of the region 108 where a wire (not shown in the figure) and the interconnect 151 are bonded together. For such a reason, it is likely that a pitch between adjacent ones of the electrodes 106 is increased, and that the size of the extension 102 where the required number of terminals are arranged is increased.

On the other hand, a semiconductor device of the present disclosure includes a first semiconductor chip; an extension formed so as to outwardly extending from a side surface of the first semiconductor chip; a connection terminal formed on the first semiconductor chip; a re-distribution part disposed over the first semiconductor chip and the extension and including an interconnect connected to the connection terminal and an insulating layer covering the interconnect; and an electrode formed above the extension on a surface of the re-distribution part and connected to part of the interconnect exposed through an opening formed in the insulating layer. The electrode is mainly made of a material having an elastic modulus higher than that of the interconnect of the re-distribution part. The electrode includes a bonding region where the electrode is bonded to the interconnect at the opening of the insulating layer, and an outer region closer to an end part of the extension than the bonding region is to the end part of the extension. The interconnect of the re-distribution part is formed so as not to continuously extend to a position right below the outer region of the electrode.

According to the foregoing, even in the case of wire bonding for the electrode provided on the re-distribution part which is formed on the extension made of an elastic body such as resin, physical damage which may be caused right below the electrode or in the periphery thereof can be reduced to the minimum possible, and therefore a highly-reliable semiconductor device can be provided. Moreover, while connection reliability of the semiconductor device can be ensured, a space required for electrode arrangement in the semiconductor device can be narrowed to the minimum possible.

BRIEF DESCRIPTION OF THE DRAWINGS

FIG. 1A is a cross-sectional view. FIG. 1B is a plan view from a side indicated by "A" in FIG. 1A.

FIG. 2A is an overhead view illustrating the entirety of the semiconductor device. FIG. 2B is a cross-sectional view along a B-B' line of FIG. 2A. FIG. 2C is a plan view from a side indicated by "A" in FIG. 2B.

FIG. 3A is a cross-sectional view. FIG. 3B is a plan view from a side indicated by "A" in FIG. 3A.

FIG. 4A is a cross-sectional view. FIG. 4B is a plan view from a side indicated by "A" in FIG. 4A.

DETAILED DESCRIPTION

Figure 1A:
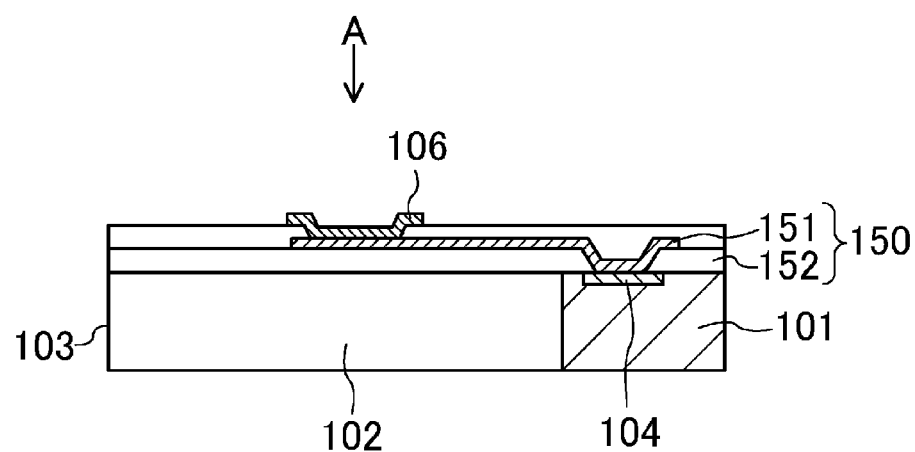
FIGS. 1A and 1B are views schematically illustrating a semiconductor device of a prior art.

A semiconductor device of one embodiment of the present disclosure will be described below with reference to drawings. In all of the drawings, the same reference numerals are used to represent equivalent elements.

First Embodiment

Figure 2A:
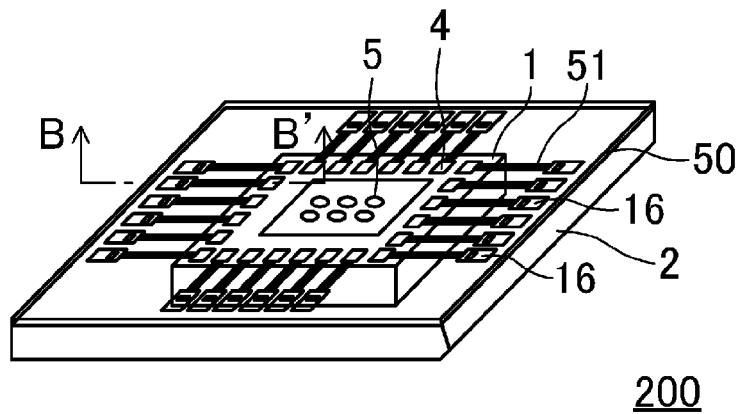
FIGS. 2A-2C are views schematically illustrating an example semiconductor device of an embodiment of the present disclosure.
Figure 2B:
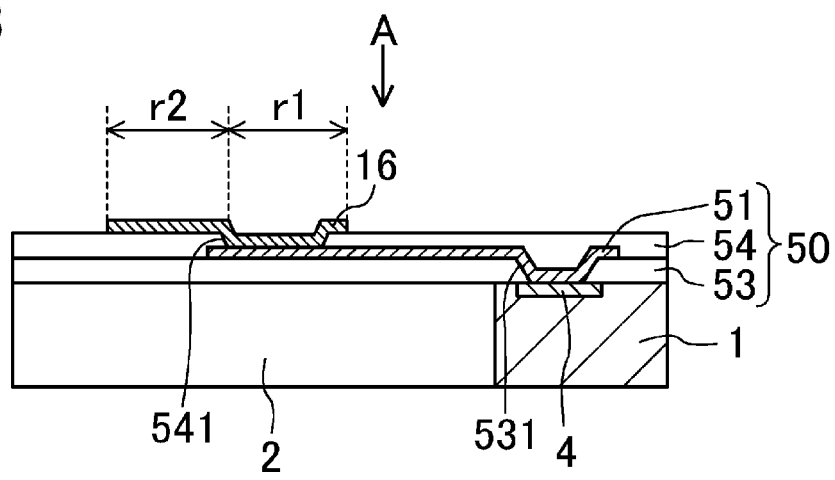
Figure 2C:
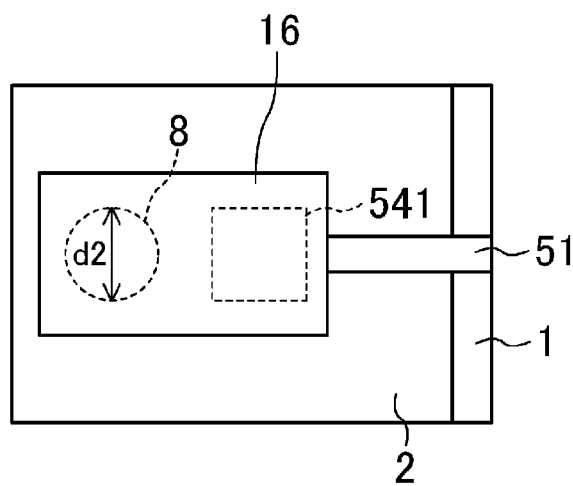

FIGS. 2A-2C are views schematically illustrating a configuration of an example semiconductor device 200 of the present embodiment. In particular, FIG. 2A is an overhead view illustrating the entirety of the semiconductor device 200. FIG. 2B is a cross-sectional view along a B-B' line of FIG. 2A. FIG. 2C is a plan view from a side indicated by "A" in FIG. 2B.

The semiconductor device 200 illustrated in FIG. 2A includes a first semiconductor chip 1 which is disposed on a lower side in a multilayer structure, and an extension 2 formed so as to outwardly extend from an outer circumferential wall (side surface) of the semiconductor chip 1. Connection terminals 4 are provided at a circumferential part of the semiconductor chip 1 on an upper surface thereof, and an RDL 50 including interconnects 51 for an access to functions of the semiconductor chip 1 through the connection terminals 4 is formed over the semiconductor chip 1 and the extension 2. Openings 541 are formed at a surface of the RDL 50 within a region thereof above the extension 2. At each opening 541, an electrode 16 for wire bonding is formed so as to be connected to the interconnect 51. More specifically, the following structure is employed.

The semiconductor chip 1 using silicon as its material includes, at a surface thereof facing a second semiconductor chip (not shown in the figure) stacked on the semiconductor chip 1, a circuit providing electric functions. Moreover, the semiconductor chip 1 further includes the plurality of first connection terminals 4 and a plurality of second connection terminals 5 for CoC connection to the second semiconductor chip. Examples of the material of the connection terminals 4, 5 include metal materials such as aluminum and copper. Since each connection terminal 4 is for the access from the RDL 50, a pad for each connection terminal 4 is formed so as to have a width of about 30-100 μm. On the other hand, the connection terminal 5 has, in order to allow bonding with a small pitch, a width of about 10-30 μm which is less than the width of the connection terminal 4. The width of the connection terminal 4 means the width of the connection terminal 4 along a pad side substantially perpendicular to the direction in which the RDL 50 extends from the connection terminal 4 to the electrode 16.

The extension 2 is formed so as to cover the side surface of the semiconductor chip 1 and to outwardly extend from the semiconductor chip 1, and the material of the semiconductor chip 1 is an elastic body such as resin. The upper surface of the semiconductor chip 1 and an upper surface of the extension 2 are flush with each other, and the RDL 50 including the interconnects 51 for the access through the connection terminals 4 is formed over the semiconductor chip 1 and the extension 2.

Referring to FIG. 2B, the RDL 50 includes a first insulating layer 53, the interconnects 51 formed on the first insulating layer 53, and a second insulating layer 54 formed on the first insulating layer 53 such that the interconnects 51 are interposed between the first insulating layer 53 and the second insulating layer 54. For example, polyimide or poly benzoxazole (PBO) is used for the first insulating layer 53 and the second insulating layer 54, and a metal material such as copper and aluminum is used for the interconnect 51.

Referring to FIGS. 2B and 2C, openings 531 are formed in the first insulating layer 53 such that the connection terminals 4 of the semiconductor chip 1 are exposed through the first insulating layer 53. Each interconnect 51 is formed so as to cover a corresponding one of the openings 531. The connection terminal 4 and the interconnect 51 are connected together at the opening 531, and the access from the interconnect 51 to the circuit of the semiconductor chip 1 is made. The interconnect 51 for the access through the connection terminal 4 is formed on the first insulating layer 53 so as to cross over a boundary between the semiconductor chip 1 and the extension 2 and to extend from the semiconductor chip 1 to the vicinity of an outer edge of the extension 2.

In part of the second insulating layer 54 right above the extension 2, the openings 541 at each of which a corresponding one of the interconnects 51 is exposed through the second insulating layer 54 are formed. Each electrode 16 is formed so as to cover a corresponding one of the openings 541. The interconnect 51 and the electrode 16 are connected together at the opening 541.

For the electrode 16, a metal material such as nickel is used as a base material. A material such as gold or palladium is used at the outermost surface of the electrode 16. The electrode 16 may have a typical width required for wire bonding, e.g., a width of about 30-100 µm. A typical method for forming the electrode 16 is electrolytic plating. A seed layer (not shown in the figure) made of, e.g., titanium, tungsten, or copper is formed at an interface between the second insulating layer 54 and the electrode 16 and an interface between part of the interconnect 51 exposed through the opening 541 and the electrode 16.

Although the electrode 16 is formed so as to cover the opening 541, the electrode 16 further extends toward an end part of the extension 2, and is smoothly formed such that a certain area required for bonding is ensured on the second insulating layer 54. More specifically, the electrode 16 has a bonding region r1 in the vicinity of a bounding part of the electrode 16 and the interconnect 51 in the opening 541, and an outer region r2 positioned closer to the end part of the extension 2 than the bonding region r1 is to the end part of the extension 2 and including a region 8 required for wire bonding. In the outer region r2, wire bonding is performed. In this state, the interconnect 51 continuously extends close to the outer region r2, but is formed so as not to extend to a position right below the outer region r2. In other words, the interconnect 51 does not continuously extend to the position right below the outer region r2. Moreover, the other metal materials are not arranged right below the outer region r2, and only the elastic bodies forming, e.g., the first insulating layer 53, the second insulating layer 54, and the extension 2 are arranged right below the outer region r2.

According to the present embodiment, in the semiconductor device 200, CoC connection between the semiconductor chip 1 and the second semiconductor chip (memory chip) with a small pitch of equal to or less than 40 µm within the region of the semiconductor chip 1 can be realized. Moreover, the access using wire bonding connection can be made on the extension 2. Thus, even if the second semiconductor chip is larger than the first semiconductor chip 1, conditions for conventional versatile wire bonding and pitch rules for conventional versatile interposers can be used in such a manner that only the size of the extension 2 is changed. As a result, inexpensive packaging can be realized.

In the semiconductor device 200, each interconnect 51 does not extend to the position right below the outer region r2 of a corresponding one of the electrodes 16 where wire bonding is made, and mechanical properties of the first insulating layer 53, the second insulating layer 54, and the resin extension 2 are substantially similar to each other. Thus, strain at an interface between the first insulating layer 53 and the second insulating layer 54 and an interface between the first insulating layer 53 and the resin extension 2 due to deformation caused by, e.g., heat, a load, or oscillation upon bonding can be reduced.

Since no interface between the less-adhesive interconnect 51 and each of the first insulating layer 53 and the second insulating layer 54 is formed right below a bonding point, physical damage at such an interface can be reduced even if an impact of bonding is transmitted. In particular, if the electrode 16 is made of metal containing nickel having a high elastic modulus, adhesion is ensured by an influence of the seed layer formed right below the electrode 16, and therefore the amount of deformation of the electrode 16 itself is decreased. As a result, damage at an interface between the electrode 16 and the second insulating layer 54 can be reduced, and this can contribute a lot to improvement of reliability of the semiconductor device.

Further, in the semiconductor device 200, the electrode 16 may be formed so as to have the width d2 of the region 8 required for wire bonding together with the margin for misalignment in bonding, and a margin for the opening 541 is not necessarily taken into consideration. Thus, as compared to the semiconductor device of the prior art as illustrated in FIG. 1B, a space required for electrode arrangement can be narrowed, and therefore the size of the semiconductor device can be reduced.

(First Variation of First Embodiment)

Figure 3A:
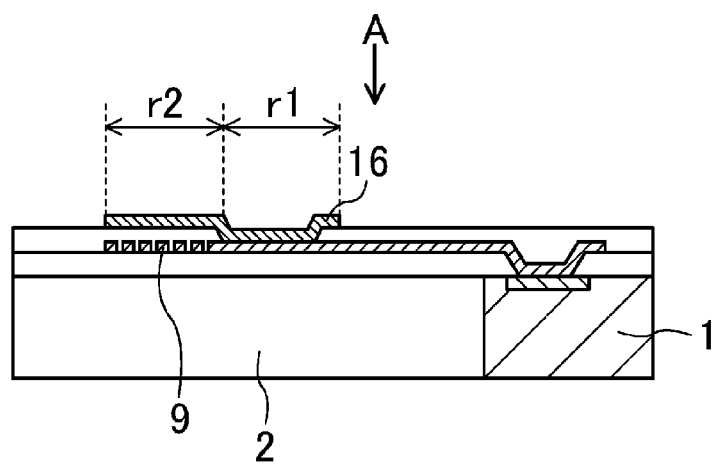
FIGS. 3A and 3B illustrate a variation of the semiconductor device illustrated in FIGS. 2A-2C.
Figure 3B:
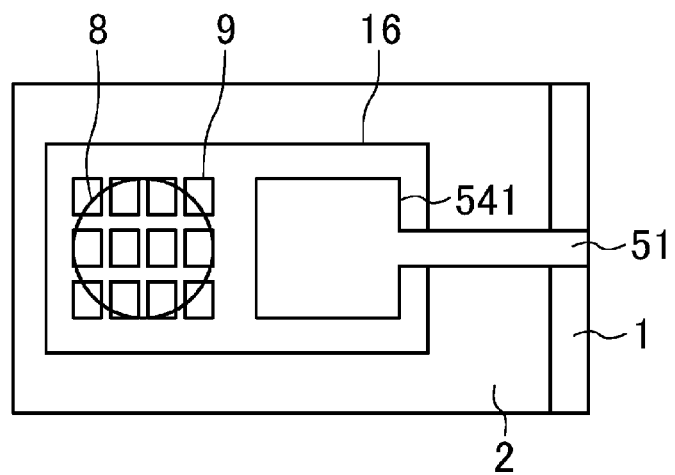

Next, a first variation of the first embodiment will be described. FIGS. 3A and 3B are views schematically illustrating a configuration of a semiconductor device 210 of the present variation. FIG. 3A is a cross-sectional view, and FIG. 3B is a plan view from a side indicated by "A" in FIG. 3A.

In the first embodiment, the interconnect 51 does not extend, referring to, e.g., FIG. 2B, to the position right below the outer region r2 of the electrode 16, and no other meal materials are provided. On the other hand, in the semiconductor device 210 of the present variation as illustrated in FIG. 3A, metal material parts 9 are discontinuously arranged right below the outer region r2 of the electrode 16. At least in this point, the semiconductor device of the present variation is different from the semiconductor device of the first embodiment. Referring to FIG. 3B, the region 8 of the electrode 16 required for bonding overlaps with the metal material parts 9 in a thickness direction of the semiconductor device 210.

Figure 1B:
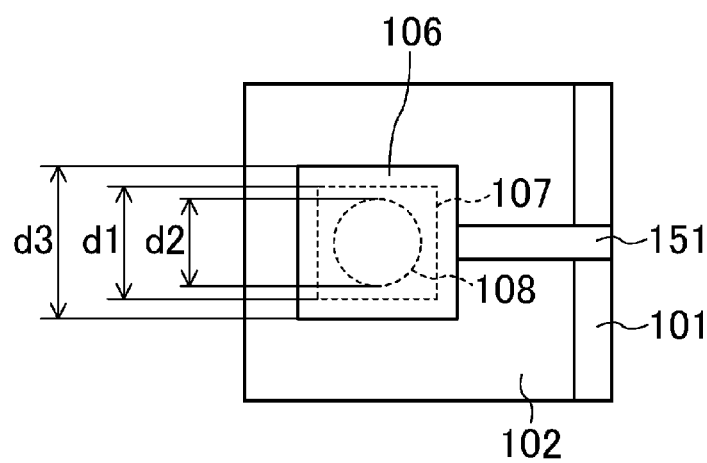

The semiconductor device of the present variation is similar to the semiconductor device of the prior art as illustrated in FIGS. 1A-1B are similar to each other in that strain between the metal material and the first insulating layer 53 is caused due to heat, a load, or oscillation upon wire bonding. However, an area where the discontinuously-formed metal material parts and the first insulating layer 53 contact each other is large, and therefore an influence of strain can be distributed and reduced. Thus, physical damage such as detachment and cracking is less likely to occur, and damage at the interface between the electrode 16 and the second insulating layer 54 can be reduced. As in the first embodiment, this contributes a lot to improvement of the reliability of the semiconductor device.

The metal material part 9 may be made of the same material as that of the interconnect 51, or may be made of a material different from that of the interconnect 51. It is easier that the metal material parts 9 and the interconnects 51 are formed in the same process.

(Second Variation of First Embodiment)

Figure 4A:
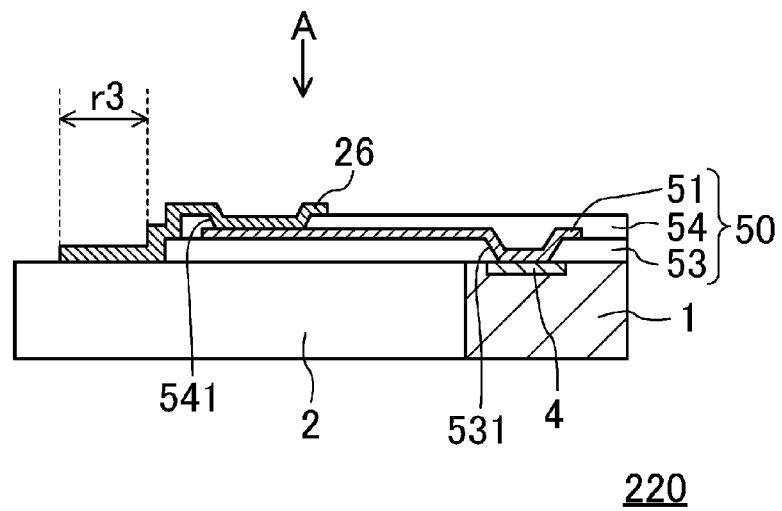
FIGS. 4A and 4B illustrate another variation of the semiconductor device illustrated in FIGS. 2A-2C.
Figure 4B:
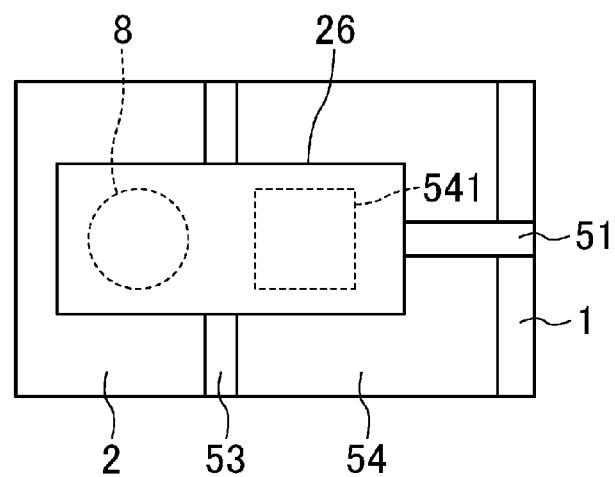

Next, a second variation of the first embodiment will be described. FIGS. 4A and 4B are views schematically illustrating a configuration of a semiconductor device 220 of the present variation. FIG. 4A is a cross-sectional view, and FIG. 4B is a plan view from a side indicated by "A" in FIG. 4A.

In the first embodiment, the electrode 16 is substantially smoothly formed over the bonding region r1 and the outer region r2 on the RDL 50. On the other hand, in the semiconductor device 220 illustrated in FIG. 4A, a step is formed between the extension 2 and each of the first insulating layer 53 and the second insulating layer 54, and therefore an electrode 26 is also in a stepped shape. In this point, the semiconductor device of the present variation is different from the semiconductor device of the first embodiment.

More specifically, an end part of the first insulating layer 53 is formed on an inner side relative to the end part of the extension 2, and an end part of the second insulating layer 54 is formed on an inner side relative to the end part of the first insulating layer 53. Thus, the extension 2 is exposed at an outer circumferential part thereof. The electrode 26 extends from the opening 541 to the exposed part of the extension 2 through the step forming the end parts of the first insulating layer 53 and the second insulating layer 54, and therefore a substantially flat region r3 is ensured on the extension 2.

In the present variation, the region 8 required for bonding is, referring to FIG. 4B, ensured in the region r3 of the electrode 26 extending over the extension 2, and the region 8 is used for bonding. Thus, the interconnect 51, an interface between the first insulating layer 53 and the second insulating layer 54, and an interface between the first insulating layer 53 and the extension 2 are not positioned right below a bonding point of the electrode 26. Thus, physical damage can be further reduced. This contributes a lot more to improvement of the reliability of the semiconductor device.

Although the end part of the second insulating layer 54 is formed on the inner side relative to the end part of the first insulating layer 53 in the present variation, the end part of the first insulating layer 53 and the end part of the second insulating layer 54 may be formed so as to be flush with each other.

Although the embodiment of the present disclosure and the variations thereof have been described, additional matters employed commonly for the embodiment and the variations will be described.

The interconnect 51 is formed by plating or sputtering, and is made of metal containing copper or aluminum. On the other hand, the electrodes 16, 26 for wire bonding are formed by, e.g., plating, and use, e.g., nickel as a material having an elastic modulus higher than that of the interconnect 51.

The extension 2 is disposed around four sides of the semiconductor chip 1 in the first embodiment, but the present disclosure is not limited to such a configuration. For example, the extension 2 may cover only a pair of opposing sides of the semiconductor chip 1, or may extend from three sides of the semiconductor chip 1. Alternatively, the extension 2 may also cover a back surface of the semiconductor chip 1.

The range indicated by "about," "substantially," and "e.g." in each of the embodiment and the variations covers the range understood by those skilled in the art, and includes errors in the case of a typical manufacturing method.

In FIGS. 1B, 2C, and 3B, the insulating layer is not shown for the sake of simplicity of description of the features of the embodiment and the variations. In any of the embodiment and the variations of the present disclosure, the insulating layer is formed as a component.

The present disclosure has been described in detail above with reference to the embodiment, the variations, and an example manufacturing method. However, the present disclosure is not limited to the foregoing. Modification or change can be made without departing from the spirit of the present disclosure. For example, replacement of one or more of components with a substitute(s) which has not been described above can be made within the scope of the technique of the present disclosure.

The technique of the present disclosure is applicable to a wide range of electronic devices using CoC-type semiconductor devices in each of which, e.g., resin is applied around a lower semiconductor chip to expand such a chip.

What is claimed is:

1. A semiconductor device comprising:
    a first semiconductor chip;
    an extension formed so as to outwardly extending from a side surface of the first semiconductor chip;
    a connection terminal formed on the first semiconductor chip;
    a re-distribution part disposed over the first semiconductor chip and the extension and including an interconnect connected to the connection terminal and an insulating layer covering the interconnect; and
    an electrode formed above the extension on a surface of the re-distribution part and connected to part of the interconnect exposed through an opening formed in the insulating layer,
    wherein the electrode is mainly made of a material having an elastic modulus higher than that of the interconnect of the re-distribution part,
    the electrode includes
        a bonding region where the electrode is bonded to the interconnect at the opening of the insulating layer, and
        an outer region closer to an end part of the extension than the bonding region is to the end part of the extension, and
    the interconnect of the re-distribution part is formed so as not to continuously extend to a position right below the outer region of the electrode.

2. The semiconductor device of claim 1, wherein the interconnect of the re-distribution part is not positioned right below the outer region of the electrode.

3. The semiconductor device of claim 1, wherein no metal is positioned right below the outer region.

4. The semiconductor device of claim 1, wherein metal parts are discontinuously arranged right below the outer region of the electrode in a layer identical to a layer of the interconnect.

5. The semiconductor device of claim 1, wherein an end part of the re-distribution part is positioned on an inner side relative to the end part of the extension, part of the extension is exposed on an outer side relative to the end part of the re-distribution part, and the electrode is continuously formed over the insulating layer of the re-distribution part and the exposed part of the extension so as to extend over the end part of the re-distribution part.

6. The semiconductor device of claim 1, wherein the interconnect is made of a metal material containing copper or aluminum.

7. The semiconductor device of claim 1, wherein the electrode is made of metal containing nickel.

8. The semiconductor device of claim 1, wherein a second semiconductor chip is mounted on the first semiconductor chip.

\* \* \* \* \*